United States Patent
Vathulya et al.

(10) Patent No.: US 6,297,524 B1
(45) Date of Patent: Oct. 2, 2001

(54) MULTILAYER CAPACITOR STRUCTURE HAVING AN ARRAY OF CONCENTRIC RING-SHAPED PLATES FOR DEEP SUB-MICRON CMOS

(75) Inventors: Vickram Vathulya; Tirdad Sowlati, both of Ossining, NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/542,712

(22) Filed: Apr. 4, 2000

(51) Int. Cl.[7] ........................................... H01G 4/30
(52) U.S. Cl. .................. 257/303; 257/296; 257/298; 257/300; 257/301; 257/308; 438/238; 438/239; 438/242; 438/386; 438/399
(58) Field of Search ..................... 257/296, 298, 257/300, 301, 303, 308; 438/238, 239, 386, 242, 399

(56) References Cited

U.S. PATENT DOCUMENTS 5,583,359 * 12/1996 Ng et al. .

5,753,949 * 5/1998 Honma et al. .

FOREIGN PATENT DOCUMENTS 11-312855 A * 11/1999 (JP) ................................. H05K/1/16

* cited by examiner

*Primary Examiner*—Nathan Flynn
*Assistant Examiner*—Kevin Quinto

(57) ABSTRACT

A capacitor structure having a first and at least a second conductor level of electrically conductive concentric ring-shaped lines. The conductive lines of the first and at least second levels are arranged in concentric ring-shaped stacks. A dielectric material is disposed between the first and second conductor levels and between the concentric conductive lines in each of the levels. At least one electrically conductive via electrically connects the conductive lines in each stack, thereby forming a concentric array of ring-shaped capacitor plates. The concentric array of capacitor plates are electrically connected in an alternating manner to first and second terminals of opposite polarity so that capacitance is generated between adjacent plates of the array. The capacitor structure is especially useful in deep sub-micron CMOS.

11 Claims, 4 Drawing Sheets

MULTILAYER CAPACITOR STRUCTURE HAVING AN ARRAY OF CONCENTRIC RING-SHAPED PLATES FOR DEEP SUB-MICRON CMOS

RELATED APPLICATIONS

Commonly-assigned, copending U.S. patent application, Ser. No. 09/545,785, entitled "Interdigitated Multilayer Capacitor Structure For Deep Sub-Micron CMOS",filed Apr. 7, 2000.

Commonly-assigned, copending U.S. patent application Ser. No. 09/542,711, entitled "Combined Transistor-Capacitor structure In Deep Sub-Micron CMOS For Power Amplifiers", filed Apr. 4, 2000.

Commonly-assigned, copending U.S. patent application, Ser. No. 09/596,443, entitled "Multilayer Pillar Array Capacitor Structure For Deep Sub-Micron CMOS", filed Jun. 19, 2000.

Commonly-assigned, copending U.S. patent application Ser. No. 09/546,125, entitled "Multilayered Capacitor Structure With Alternately Connected Concentric Lines For Deep Sub-Micron CMOS", filed Apr. 10, 2000.

FIELD OF THE INVENTION

This invention relates to capacitor structures for metal-oxide-semiconductors (MOS), and in particular, to a capacitor structure for deep sub-micron complementary metal-oxide semiconductors (CMOS), formed by multiple levels of electrically conductive ring-shaped concentric lines connected between levels by vias that define an array of concentric ring-shaped capacitor plates.

BACKGROUND OF THE INVENTION

Conventional capacitor structures for deep sub-micron CMOS are typically constructed with two flat parallel plates separated by a thin dielectric layer. The plates are formed by layers of conductive material, such as metal or polysilicon. The capacitor structure is usually isolated from the substrate by an underlying dielectric layer. To achieve high capacitance density in these structures, additional plates are provided. FIG. 1 illustrates a conventional multilayer parallel plate capacitor structure 10 in a deep sub-micron CMOS. The capacitor structure 10 includes a vertical stack of electrically conductive lines 12 separated by dielectric layers 13. The conductive lines 12 and dielectric layers 13 are constructed over a semiconductor substrate 11. The conductive lines 12 form the plates or electrodes of the capacitor 10. The plates 12 are electrically connected together in an alternating manner such that all the "A" plates are of a first polarity and all the "B" plates are of a second polarity, opposite to the first polarity.

A major limitation associated with parallel plate capacitor structures is that the minimum distance between the plates does not change as geometries in CMOS processes are scaled down. Hence, gains in capacitance density are not realized during such down scaling.

Various other capacitor structures with high capacitance densities, such as double polysilicon capacitors and gate-oxide capacitors, are known in the art. Double polysilicon capacitors, however, do not lend themselves to deep sub-micron CMOS processes. Gate-oxide capacitors are generally not used in deep sub-micron CMOS processes because they have large gate areas which cause yield and reliability issues, they generate capacitances which vary with voltage, and may experience high voltages that can breakdown the gate-oxide.

Trench capacitor structures for dynamic random access memories (DRAMs) have high capacitance densities. Such capacitors are formed by etching a trench in the substrate and filling the trench with conductive and dielectric material to form a vertical capacitance structure. However, trench capacitors are costly to fabricated because they add etching and trench filling processes.

Interdigitated capacitor structures are used in microwave applications. These capacitors have closely placed, inter-digitated conductive line structures which produce fringing and crossover capacitances therebetween to achieve capacitance. However, the cross-over capacitance produced by interdigitated capacitors is limited to a single conductor level.

Accordingly, a need exists for an improved high capacitance density capacitor structure for deep sub-micron CMOS.

SUMMARY OF THE INVENTION

A capacitor structure comprising a first and at least a second conductor level of electrically conductive concentric lines. The conductive lines of the first and at least second levels are arranged in concentric stacks. A dielectric material is disposed between the first and second conductor levels and between the concentric conductive lines in each of the levels. At least one electrically conductive via electrically connects the conductive lines in each stack, thereby forming a concentric array of capacitor plates. The concentric array of capacitor plates are electrically connected in an alternating manner to first and second terminals of opposite polarity so that capacitance is generated between adjacent plates of the array. The capacitor structure is especially useful in deep sub-micron CMOS.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not to scale.

DETAILED DESCRIPTION OF THE INVENTION

Figure 2:
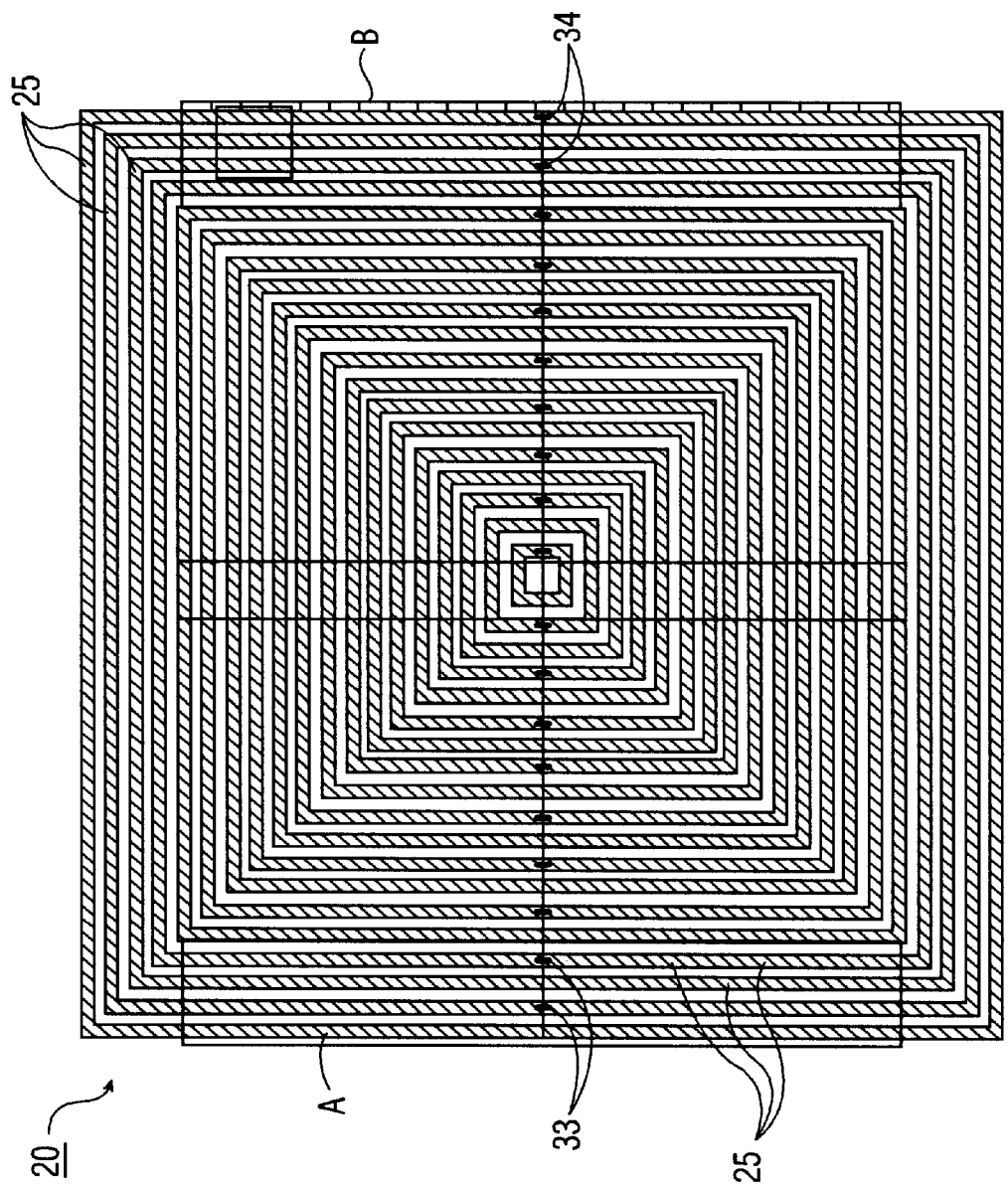
FIG. 2 is a top plan view of a capacitor structure according to an embodiment of the invention for generating capacitance in deep sub-micron CMOS.
Figure 3:
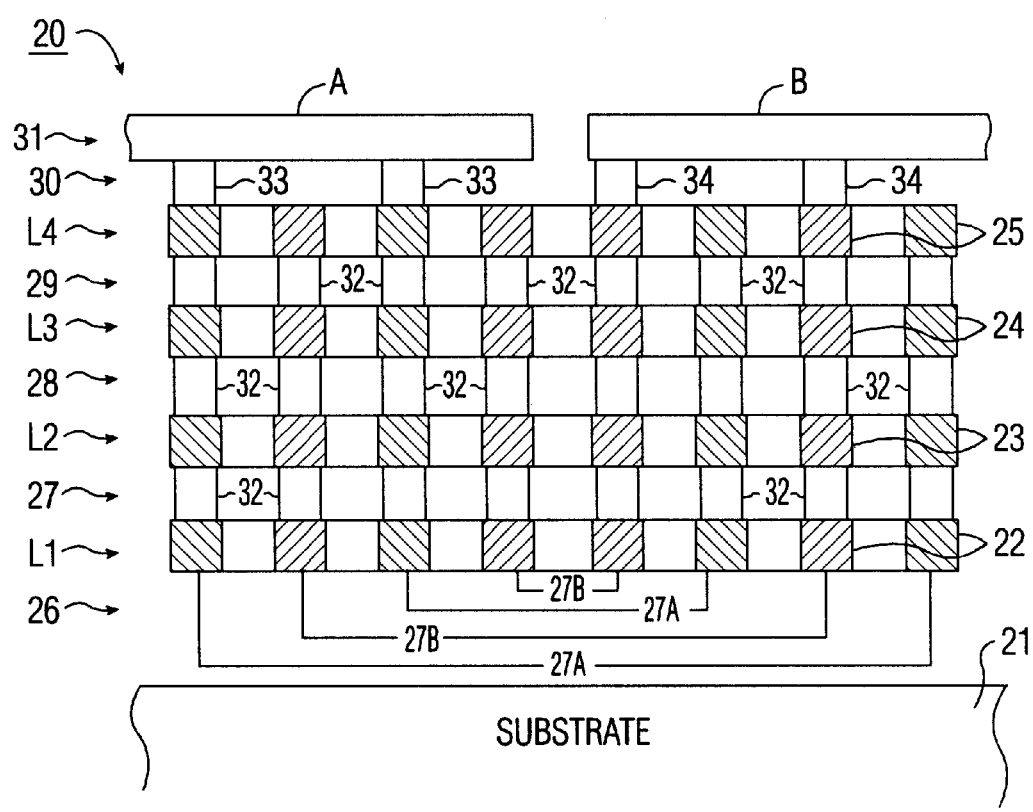
FIG. 3 is a sectional view illustrating the capacitor structure of the invention.
Figure 4:
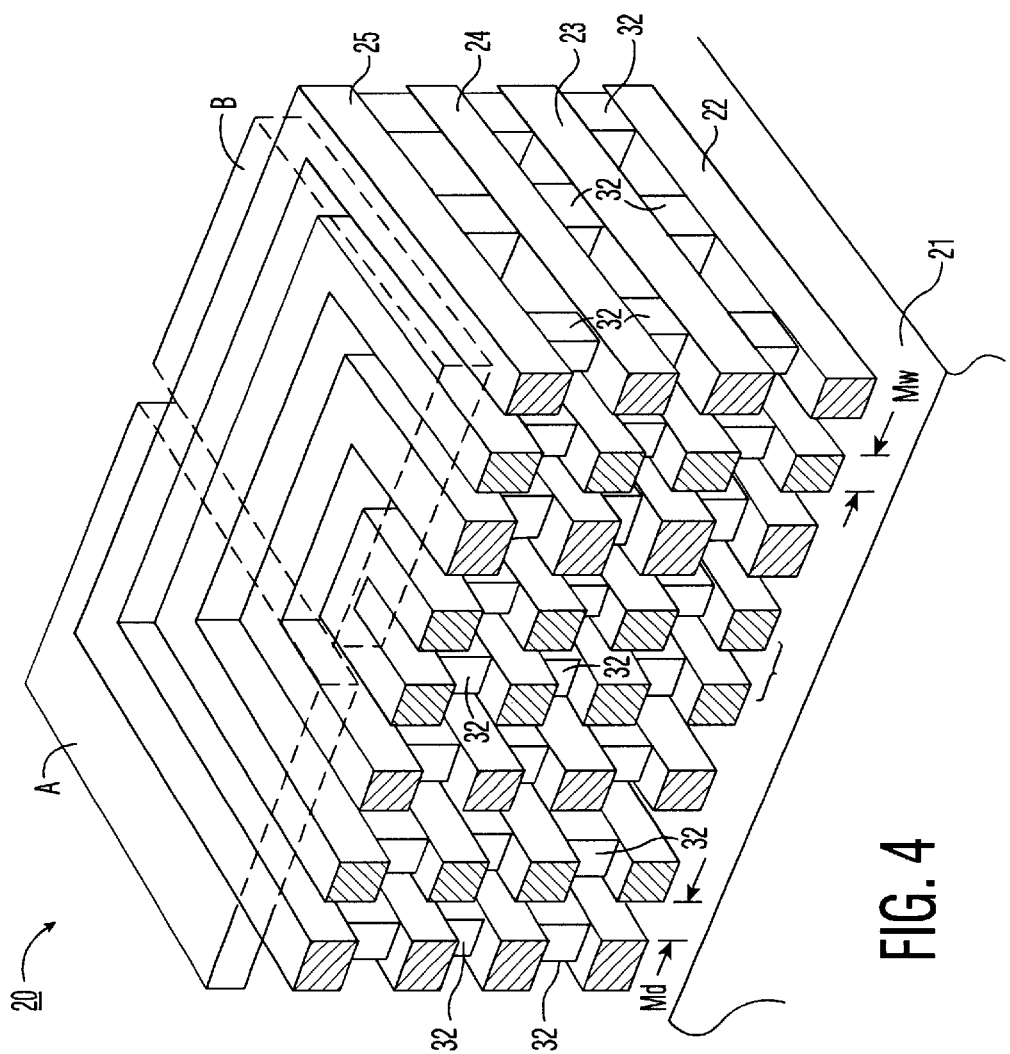
FIG. 4 is a perspective sectional view illustrating the capacitor structure of the invention.

FIGS. 2–4 collectively illustrate a capacitor structure 20 according to an embodiment of the invention for generating capacitance in deep sub-micron CMOS. The capacitor structure 20 has a capacitance density which is significantly greater than that of a conventional parallel plate capacitor structure. The capacitor structure 20 is constructed over a substrate 21 of semiconductor material in a multiple conductor level process (four electrical conductor levels L1–L4 are depicted for illustrative purposes only). The first conductor level L1 includes a first concentric array of electrically conductive ring-shaped lines 22, the second conductor level L2 includes a second concentric array of electrically conductive ring-shaped lines 23, the third conductor level L3 includes a third concentric array of electrically conductive ring-shaped lines 24, and the fourth conductor level L4 includes a fourth concentric array of electrically conductive ring-shaped lines 25. As illustrated, the ring-shaped conductive lines 22–25 have a square geometry, however, the lines 22–25 can also be formed in rectangular, octagonal, or circular geometries to name a few. In present state-of-the-art deep sub-micron CMOS technology, conductive line spacings of about 0.5 microns or less is common. Thus, the minimum distance $M_d$ between the concentric conductive lines in each conductor level of the capacitor structure 20 is typically equal to or less than about 0.5 microns.

A first dielectric layer 26 fills the space between the substrate 21 and the first conductor level L1; a second dielectric layer 27 fills the space between the first and second conductor levels L1, L2 and the spaces between the concentric lines 22 of the first conductor level L1; a third dielectric layer 28 fills the space between the second and third conductor levels L2, L3 and the spaces between the concentric lines 23 of the second level L2; a fourth dielectric layer 29 fills the space between the third and fourth conductor levels L3, L4 and the spaces between the concentric lines 24 of the third conductor level L3; and a fifth dielectric layer 30 fills the space between the fourth conductor level and a contact layer 31, and the spaces between the concentric lines 25 of the fourth conductor level L4. The conductive lines 23–25 of the second, third and fourth levels L2–L4 substantially overlie corresponding lines 22 of the first level L1, thereby forming concentric stacks of lines. The conductive lines 22–25 in each stack are electrically connected by a first set of electrically conductive vias 32 extending through the second, third, and fourth dielectric layers. The resulting structure forms a concentric array of ring-shaped capacitor electrodes or plates 27A, 27B.

The array of concentric ring-shaped capacitor plates 27A, 27B are electrically connected in an alternating manner to first and second terminals A, B of opposite polarities, defined in the contact layer 31. In particular, all the ring-shaped capacitor plates designated 27A are electrically connected to the first terminal A in the contact layer 31 with a second set of vias 33 that extend through the fifth dielectric layer 30. All the ring-shaped capacitor plates designated 27B are electrically connected to the second terminal B in the contact layer 31 with a third set of vias 42 that extend through fifth dielectric layer 30.

Figure 1:
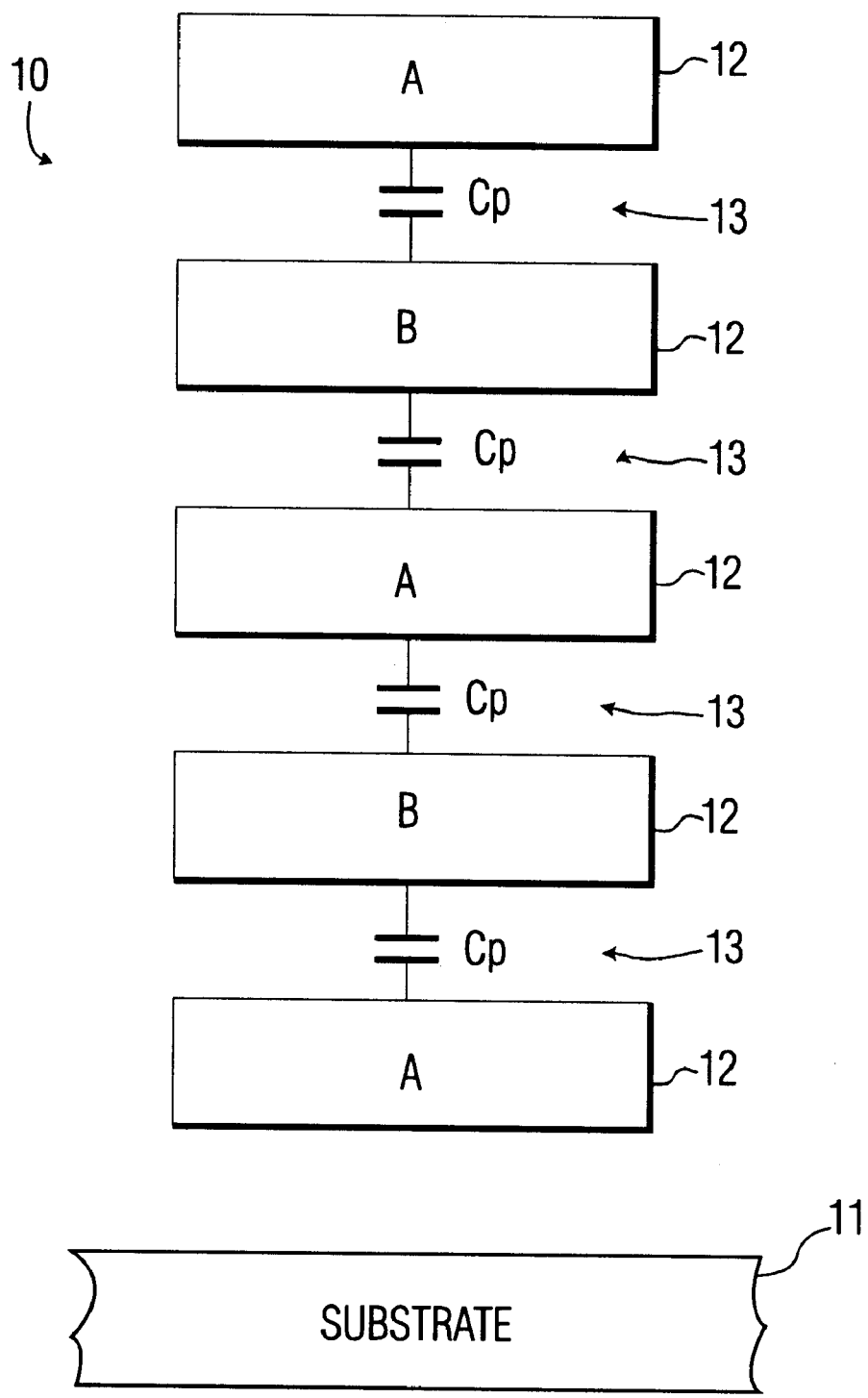
FIG. 1 is an elevational side view of a conventional parallel plate capacitor structure in a deep sub-micron CMOS.

The capacitor structure of the invention has a capacitance density which is about three times that of a conventional parallel plate capacitor structure, because it generates crossover capacitance $C_c$ between adjacent concentric conductive lines in each of the conductor levels. The improvement in capacitance density can be seen by comparing the capacitance of a conventional parallel plate capacitor similar to the one shown in FIG. 1 constructed with five (5) plates and having dimensions of 39.2 microns×39.2 microns, with a capacitor made according to the invention constructed with 4 conductor levels and having dimensions of 38.6 microns× 38.6 microns. Both capacitors were constructed in a 0.25 micron CMOS process. The parallel plate capacitor had a capacitance of about 217 fF and a capacitance per unit area of about 0.14 fF/m$^2$. In comparison, the capacitor made according to the invention had a capacitance of about 652.2 fF and a capacitance per unit area of about 0.44 fF/m$^2$. This represents a 215 percent increase over the conventional parallel plate capacitor, even without accounting for the additional capacitance that will come from via-to-via capacitance between adjacent plate, which can be significant. Much of this capacitance increase is due to the significantly smaller minimum distance between the plates. In a 0.25 micron CMOS process, the line separation is about 0.4 microns. Accordingly, the minimum distance between the ring-shaped plates of the capacitor structure of the invention is about 0.4 microns as compared to about the one micron vertical separation between the plates of the conventional parallel plate capacitor structure.

Further, the capacitance density of the capacitor structure of the invention will advantageously increase as the geometries in semiconductor process technologies continue to shrink and scale down because the minimum width $M_w$ of the concentric lines 22–25 and the minimum distance $M_d$ between concentric lines 22–25 in each of the levels L1–L4 will advantageously decrease.

Such capacitance increases are not possible in conventional multilayer parallel plate capacitor structures because the heights or thicknesses of the conductor and dielectric levels do not scale down. Hence, the distance between the plates will remain about 1 micron in conventional parallel plate capacitor structures.

The capacitor structure of the invention is typically manufactured in silicon using conventional deep sub-micron CMOS processing. The capacitor structure of the invention can also be manufactured in gallium arsenide or any other suitable semiconductor system using conventional deep sub-micron processing. Manufacturing in silicon using deep sub-micron CMOS processing, usually involves growing or depositing a first layer of silicon dioxide on a selected portion of a silicon semiconductor substrate to form the first dielectric layer. The silicon dioxide layer has a thickness in the range of about one micron. A first layer of metal, such as aluminum, or highly conductive polysilicon, is deposited on the first dielectric layer of silicon dioxide and then defined into the concentric conductive lines using well known masking and dry etching techniques to form the first conductor level. As mentioned above, the width and spacing of the conductive lines are set to the minimum dimensions of the process to enhance the capacitance of the structure, i.e., the lines and spacing between the lines are as narrow as possible.

A second layer of silicon dioxide is then grown or deposited over the conductive lines to form the second dielectric layer. The thickness of the second dielectric layer of silicon dioxide is in the range of about one micron. A plurality of holes, which extend down to the first conductor level are defined in the second dielectric layer of silicon dioxide and then filled with metal or polysilicon using conventional via fabrication techniques to form the vertically extending vias in the second dielectric layer. A second layer of metal, such as aluminum, or polysilicon, is deposited on the second dielectric layer of silicon dioxide and then defined into the concentric conductive lines of the second conductor level. The remaining dielectric layers, vias, conductor levels, and conductive lines, are fabricated in the same manner as described above.

One of ordinary skill in the art will recognized that specialized dielectric materials can be used in place of silicon dioxide (silicon systems) or silicon nitride (gallium arsenide systems) to form the dielectric layers. For example a ferro-electric ceramic, such as PLZT (lanthanum-modified lead zirconate tantalate) can be used to form the dielectric layers. The use of PLZT layers greatly enhances capacitance as PLZT has a dielectric constant of approximately 4,700, in contrast to 3.9 for the dielectric constant of silicon dioxide.

The ordinary skill artisan will further recognize that the capacitor of the invention can be useful in many applications, such as RF, analog and digital applications. RF circuit applications employ capacitors for matching. The larger the capacitance per unit area, the smaller the area and the lower the cost. In analog circuit applications, undesirable noise can often be reduced by using large capacitors (KT/C). In digital circuit applications, large decoupling capacitances are often very important and can be easily provided with the capacitor of the invention. The capacitor structure of the invention also lends itself to being easily programmed into a standard pcell for layout generation.

While the foregoing invention has been described with reference to the above embodiment, additional modifications and changes can be made without departing from the spirit of the invention. Accordingly, such modifications and changes are considered to be within the scope of the appended claims.

What is claimed is:

1. A capacitor comprising:

a first conductor level of electrically conductive concentric lines;

at least a second conductor level of electrically conductive concentric lines, the conductive lines of the first and at least second levels arranged in concentric stacks;

a dielectric material disposed between the first and second conductor levels and between the concentric conductive lines in each of the levels;

at least one electrically conductive via electrically connecting the conductive lines in each stack, thereby forming an array of concentric capacitor plates, each conductive via extending through the dielectric material between the first and second conductor levels; and first and second terminals having opposite electrical polarities;

wherein the array of concentric capacitor plates are electrically connected in an alternating manner to the terminals of opposite polarity so that capacitance is generated between adjacent plates of the array.

2. The capacitor according to claim 1, wherein the conductive lines and the plates formed thereby have a ring-shaped structure.

3. The capacitor according to claim 1, wherein the conductive lines and the plates formed thereby have a square ring-shaped structure.

4. The capacitor according to claim 1, wherein the capacitor is constructed over a substrate.

5. The capacitor according to claim 4, wherein the substrate is made from a semiconductor material.

6. The capacitor according to claim 1, wherein the capacitor comprises a sub-micron MOS structure.

7. The capacitor according to claim 1, wherein the capacitor comprises a sub-micron CMOS structure.

8. The capacitor of claim 1, wherein the capacitor comprises a sub-micron structure.

9. The capacitor according to claim 1, wherein the conductive lines are made from one of a metal material and a conductive semiconductor material.

10. The capacitor according to claim 1, wherein the at least second conductor level of electrically conductive concentric lines is a plurality of conductor levels of electrically conductive concentric lines, the conductive lines of all the levels arranged in concentric stacks.

11. The capacitor according to claim 1, wherein the at least one electrically conductive via is a plurality of electrically conductive vias.

* * * * *